United States Patent
Weiss et al.

(10) Patent No.: US 7,248,667 B2
(45) Date of Patent: Jul. 24, 2007

(54) ILLUMINATION SYSTEM WITH A GRATING ELEMENT

(75) Inventors: Markus Weiss, Aalen (DE); Wolfgang Singer, Aalen (DE); Bernd Kleemann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 09/961,819

(22) Filed: Sep. 24, 2001

(65) Prior Publication Data

US 2002/0186811 A1  Dec. 12, 2002

Related U.S. Application Data

(63) Continuation-in-part of application No. 09/679,718, filed on Sep. 29, 2000, now Pat. No. 6,438,199, which is a continuation-in-part of application No. 09/305,017, filed on May 4, 1999, now Pat. No. 6,198,793.

(30) Foreign Application Priority Data

Jun. 6, 2001   (DE)  ................ 101 27 298

(51) Int. Cl.
  *G21K 5/04*   (2006.01)
  *G21K 1/06*   (2006.01)
  *G02B 27/44*  (2006.01)

(52) U.S. Cl. .......... 378/34; 378/84; 250/492.2; 355/67; 355/71; 359/566; 359/569

(58) Field of Classification Search .......... 378/34, 378/84, 85; 356/305, 328, 334, 308; 250/237 R, 250/237 G, 492.2; 359/566, 569, 366, 369, 359/568; 355/67, 71
See application file for complete search history.

(56) References Cited

U.S. PATENT DOCUMENTS

| | | | |
|---|---|---|---|
| 4,195,913 A | 4/1980 | Dourte et al. | 350/292 |
| 4,294,538 A | 10/1981 | Ban | 355/51 |
| 4,389,115 A | 6/1983 | Richter | 355/26 |
| 4,651,012 A | 3/1987 | Clark et al. | 250/505.1 |
| 4,705,396 A * | 11/1987 | Bergstrom | 356/332 |
| 4,740,276 A | 4/1988 | Marmo et al. | 204/7 |
| 4,798,446 A * | 1/1989 | Hettrick | 359/570 |
| 4,991,934 A * | 2/1991 | Hettrick | 359/570 |

(Continued)

FOREIGN PATENT DOCUMENTS

| | | |
|---|---|---|
| EP | 0066295 | 12/1982 |
| EP | 0359018 | 3/1990 |
| EP | 0939341 | 9/1999 |
| EP | 1026547 | 8/2000 |
| JP | 07301696 | 11/1995 |
| WO | WO01/09681 A2 | 2/2001 |

OTHER PUBLICATIONS

Eugene Hecht and Alfred Zajac, Optics, Addison-Wesley, Reading, MA, 1979, p. 116, 117, and 151.*

(Continued)

*Primary Examiner*—Allen C. Ho
(74) *Attorney, Agent, or Firm*—Ohlandt, Greeley, Ruggiero & Perle, L.L.P.

(57) ABSTRACT

An illumination system, particularly for wavelengths ≦100 nm, with an object plane and a field plane, comprises a grating element and a physical diaphragm in a diaphragm plane, which is arranged downstream to the grating element in the beam path from the object plane to the field plane.

40 Claims, 7 Drawing Sheets

U.S. PATENT DOCUMENTS

| | | | | |
|---|---|---|---|---|
| 5,003,567 | A * | 3/1991 | Hawryluk et al. | 378/34 |
| 5,148,442 | A | 9/1992 | O'Neil et al. | 372/71 |
| 5,163,078 | A * | 11/1992 | Iketaki | 378/85 |
| 5,222,112 | A | 6/1993 | Terasawa et al. | 378/34 |
| 5,274,435 | A * | 12/1993 | Hettrick | 356/328 |
| 5,315,629 | A * | 5/1994 | Jewell et al. | 378/34 |
| 5,339,346 | A | 8/1994 | White | 378/34 |
| 5,361,292 | A * | 11/1994 | Sweatt | 378/34 |
| 5,402,267 | A | 3/1995 | Furter et al. | 359/727 |
| 5,439,781 | A * | 8/1995 | MacDowell et al. | 430/311 |
| 5,440,423 | A | 8/1995 | Ogura | 359/365 |
| 5,512,759 | A | 4/1996 | Sweatt | 250/492.1 |
| 5,528,364 | A * | 6/1996 | Koike | 356/334 |
| 5,557,398 | A * | 9/1996 | Wechsler et al. | 356/318 |
| 5,581,605 | A | 12/1996 | Murakami et al. | 378/84 |
| 5,647,664 | A | 7/1997 | Hanecka | 362/308 |
| 5,669,708 | A | 9/1997 | Mashima et al. | 362/341 |
| 5,677,939 | A | 10/1997 | Oshino | 378/34 |
| 5,737,137 | A | 4/1998 | Cohen et al. | 359/859 |
| 5,755,503 | A | 5/1998 | Chen et al. | 353/38 |
| 5,805,365 | A * | 9/1998 | Sweatt | 359/858 |
| 5,822,060 | A * | 10/1998 | Linowski et al. | 356/318 |
| 5,848,119 | A * | 12/1998 | Miyake et al. | 378/34 |
| 5,896,438 | A | 4/1999 | Miyake et al. | 378/34 |
| 5,993,010 | A | 11/1999 | Ohzawa et al. | 353/99 |
| 5,995,582 | A | 11/1999 | Terashima et al. | 378/34 |
| 6,072,852 | A * | 6/2000 | Hudyma | 378/34 |
| 6,118,577 | A * | 9/2000 | Sweatt et al. | 359/351 |
| 6,198,739 | B1 | 3/2001 | Neyman et al. | 370/353 |
| 6,233,056 | B1 | 5/2001 | Naulleau et al. | 356/520 |
| 6,259,764 | B1 * | 7/2001 | Evans-Lutterodt et al. | 378/84 |
| 6,307,913 | B1 * | 10/2001 | Foster et al. | 378/34 |
| 6,312,373 | B1 * | 11/2001 | Ichihara | 356/515 |
| 6,469,827 | B1 * | 10/2002 | Sweatt et al. | 359/351 |
| 6,836,530 | B2 * | 12/2004 | Singer et al. | 378/34 |

OTHER PUBLICATIONS

Haferkorn et al., Optics Lexicon, VEB Bibliographic Institute, Leipzig, pp. 48-49, 1999.

Murty, "Use of Convergent and Divergent Illumination with Plane Gratings", Journal of the Optical Society of America, vol. 52, No. 7, pp. 768-773, Jul. 1962.

Oshio et al., A Theory of New Astigmatism and Coma-Free Spectrometer, Nuclear Instruments and Methods, 208, pp. 297-301, 1993.

Petersen et al., Review of Plane Grating Focusing for Soft X-ray Monochromators, Rev. Sci. Instrum., 66(1), Jan. 1996.

Paul, "Lexikon der Optik", Spectrum, Bd. 1 A bis L 1999, Akademischer Verlag GmbH pp. 77-80, 1999.

Beguiristain, "Thermal Distortion Effects on Optical Substrates that Reduce Coherence Properties of Undulator Beam Lines", Center for X-ray Optics, Lawrence Berkeley Laboratory, pp. 210-215, 1993.

Murphy, et al., "Synchrotron Radiation Sources and Condensers for Projection X-Ray Lithography", Applied Optics, vol. 32, No. 34, pp. 6920-6929 (Dec. 1, 1993).

European Search Report dated Mar. 3, 2006 in respect to European Application No. 01123195.8.

Fukuda et al., "Design and Analysis of Diffraction Mirror Optics for EUV Projection Lithography", Microelectronic Engineering vol. 27, 1995, pp. 239-242.

Wilkinson et al. "First-Generation Holographic, Grazing-Incidence Gratings for Use In Converging, Extreme-Ultraviolet Light Beams", Applied Optics vol. 34, 1995, pp. 4685-4696.

* cited by examiner

ILLUMINATION SYSTEM WITH A GRATING ELEMENT

CROSS-REFERENCE TO RELATED APPLICATIONS

The present application is a continuation-in-part of U.S. patent application Ser. No. 09/679,718, filed on Sep. 29, 2000, now U.S. Pat. No. 6,438,199 B1, which is a continuation-in-part of U.S. patent application Ser. No. 09/305,017, filed on May 4, 1999, now U.S. Pat. No. 6,198,793. The present application is also claiming priority of German Patent Application Serial No. 101 27 298.7, which was filed on Jun. 6, 2001.

BACKGROUND OF THE INVENTION

1. Field of the Invention

The invention concerns an illumination system for wavelengths $\leq 100$ nm, wherein the illumination system has an object plane and a field plane. In illumination systems $\leq 100$ nm, the problem exists that light sources of such illumination systems emit radiation that can lead to an undesired exposure of the light-sensitive object in the wafer plane. Furthermore optical components of the exposure system, such as, for example, the multilayer mirror, can be heated up in this way.

In order to filter out the undesired radiation, transmission filters are used in illumination systems for wavelengths $\leq 100$ nm. Such filters have the disadvantage of high light losses. In addition, they can be disrupted very easily by heat stress.

The object of the invention is to provide an illumination system for wavelengths $\leq 100$ nm, particularly in the EUV range, in which the above-named disadvantages can be avoided.

According to the invention, this object is solved by an illumination system that has at least one grating element and at least one physical diaphragm in a diaphragm plane. The physical diaphragm is situated in the beam path from the object plane to the field plane after the grating element.

2. Description of the Prior Art

Grating elements, for example, reflection gratings, particularly echelette gratings, which are also known as blazed gratings, have been known for a long time from monochromator construction for synchrotron radiation sources. For these elements good experiences, particularly with very high fluxes, were made.

With respect to the use of diffraction gratings in monochromators, reference is made to the following publications, whose disclosure content is incorporated to the full extent in the present Application:

H. Petersen, C. Jung, C. Hellwig, W. B. Peatman, W. Gudat: "Review of plane grating focusing for soft x-ray monochromators", Rev. Sci. Instrum. 66(1), January 1996.

M. V. R. K. Murty: "Use of convergent and divergent illumination with plane gratings", Journal of the Optical Society of America, Vol. 52, No. 7, July 1962, pp. 768–773.

T. Oshio, E. Ishiguro, R. Iwanaga: "A theory of new astigmatism and coma-free spectrometer", Nuclear Instruments and Methods 208 (1993) 297–301.

SUMMARY OF THE INVENTION

The inventors have now recognized that a grating element can be used in the beam path from the object plane to the image plane for spectral filtering in an illumination system for wavelengths $\leq 100$ nm, if the individual diffraction orders and the wavelengths are clearly separated from one another.

This is most simple for a grating element within a convergent beam bundle. The convergent beam bundle has a focus with a limited diameter.

In order to obtain a stigmatic imaging of an object into the plane of the physical diaphragm with the aid of a grating element situated in a convergent beam path, in a first embodiment of the invention the optical element is curved concave in a meridional plane. The meridional plane of the optic element is defined as the plane which is perpendicular to the carrier surface of the grating element and to the grating lines.

Alternatively or additionally to this, the optical element can be curved convex in the sagittal plane, which is perpendicular to the carrier surface and the meridional plane, and contains the centre of the grating element.

If an internal diffraction order (k=1, 2, 3) is used, the refractive power in the meridional direction is greater than in the sagittal direction, i.e., the element is concave, e.g., in the meridional direction and planar in the sagittal direction, or it is planar in the meridional direction and convex in the sagittal direction, or it is formed concave in the meridional direction and convex in the sagittal direction.

If an external diffraction order (k=−1, −2, −3) is used, the refractive power in the sagittal direction is greater than in the meridional direction, i.e., the element is concave in the sagittal direction and planar in the meridional direction, or it is planar in the sagittal direction and convex in the meridional direction, or it is formed concave in the sagittal direction and convex in the meridional direction.

In the present application, the order which is diffracted to the surface normal line is denoted the internal order and assigned positive numbers, while the order which is diffracted away from the surface normal line is designated the external order and is assigned negative numbers.

In another embodiment of the invention, the stigmatic imaging is achieved by a variation of the distance between the grating lines.

The at-least one physical diaphragm according to the invention essentially serves for the purpose that light with wavelengths far above 100 nm does not enter into the illumination system. This can be achieved particularly by blocking the zeroth diffraction order. Due to the one physical diaphragm, all diffraction orders are preferably blocked except for a so called used order. The used order, for example, can be the $1^{st}$ order.

It is particularly preferred if the rays have wavelengths in the range of 7 to 26 nm after the physical diaphragm, due to the combination of grating and physical diaphragm.

The grating element is preferably designed as a blazed grating, which is optimized to a maximal efficiency in a pregiven diffraction order. Blazed gratings are known, for example, from the Lexikon der Optik [Optics Lexicon], edited by Heinz Haferkorn, VEB Bibliographic Institute, Leipzig, 1990, pp. 48 to 49. They are characterized by an approximately triangular groove profile.

In order to avoid too high of a heat load on the physical diaphragm in the diaphragm plane, a part of the undesired radiation can be filtered out by additional diaphragms in the illumination system.

In addition to the illumination system, the invention also provides a projection exposure system with such an illumination system as well as a method for the production of microelectronic components.

BRIEF DESCRIPTION OF THE DRAWINGS

An example of the invention will be described below on the basis of the figures.

Here.

DESCRIPTION OF THE INVENTION

Figure 1:
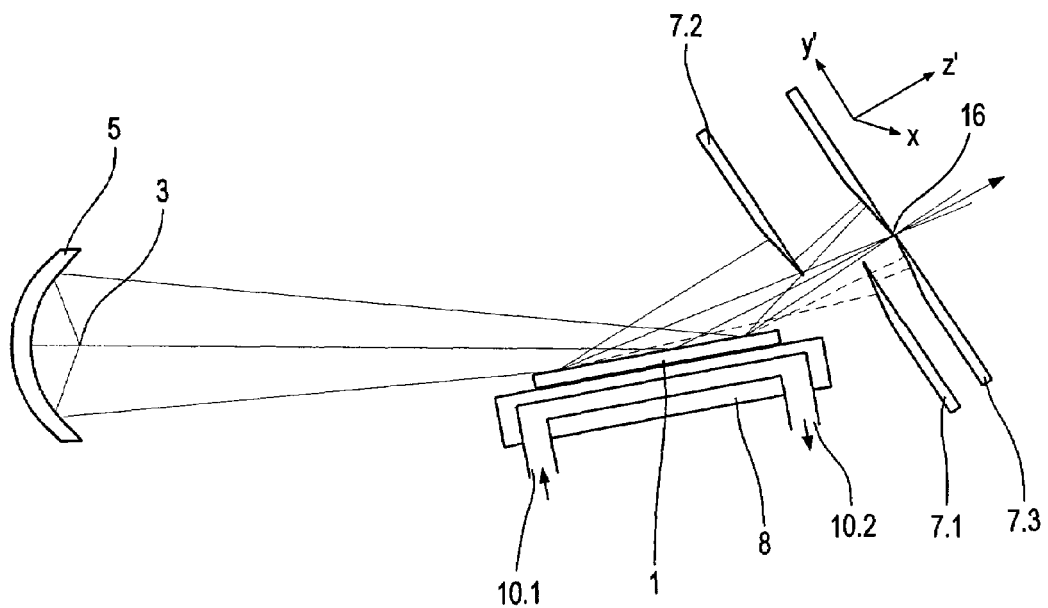
FIG. 1 shows the arrangement of a grating element in the beam path of the collector unit of an illumination system.

FIG. 1 shows an illumination system with a grating element 1 as well as a physical diaphragm in the diaphragm plane. The light of light source 3 is collected by a collecting component, collector 5, in the illumination system shown. The collector 5 in this example is an ellipsoid-shaped mirror, which produces an image of light source 3. The convergent light bundle with an aperture of approximately NA=0.1 behind collector 5 is deflected via grating element 1 in grazing incidence in such a way that the intermediate image of the light source comes to lie in or in the vicinity of the diaphragm plane of the physical diaphragm 7.3.

Due to the several partial diaphragms 7.1, 7.2, arranged in front of physical diaphragm 7.3, undesired radiation can be filtered out beforehand, in order to reduce the heat load on physical diaphragm 7.3. The physical diaphragm has a circular opening, which is situated in the focal plane of the desired diffraction order, here the −1. order 16. The diaphragms 7.1, 7.2 may also be cooled, but this is not shown. In addition, grating element 1 can be cooled, for example, by a cooling on the back side. The device 8 for back-side cooling of grating element 1 is preferably a liquid cooling device with inlet 10.1 and outlet 10.2. Due to grating element 1 and physical diaphragm 7.3, the $0^{th}$ order that encompasses all wavelengths of the light source can be completely blocked out in the illumination system according to the invention. In addition, all of the other orders except for the $-1^{st}$ order are blocked.

If the grating in an illumination system with collector according to FIG. 1 is designed as a planar grating with the same grating period, then an astigmatic imaging of the light source results. In order to be able to well separate the diffraction orders from one another, a stigmatic imaging of light source 3 into the plane of the physical diaphragm 7.3 is necessary for a diffraction order, which is not the zeroth diffraction order.

It can be attempted by various methods to correct the astigmatism, for example, by introducing additional refractive power in the meridional plane or sagittal plane or by variation of the distance between the grating lines.

How this is derived will be given in the following.

The starting point for subsequent considerations is the grating equation for a parallel beam bundle:

$$N \cdot k \cdot \lambda = \sin \alpha + \sin \beta \qquad (1)$$

wherein N is the number of lines, k is the diffraction order, $\lambda$ is the wavelength, $\alpha$ is the angle of incidence and $\beta$ is the diffraction angle (relative to the surface normal of the carrier surface and referred to the chief ray $CR_{before}$ or $CR_{after}$). The nomenclature which is used in the following derivation is oriented to the "Lexikon der Optik [Optics Lexicon] in two volumes, edited by H. Paul, Heidelberg, Berlin, Spektrum Academic Publishers, 1999, Vol. 1, A–L, pp. 77–80.

Figure 2:
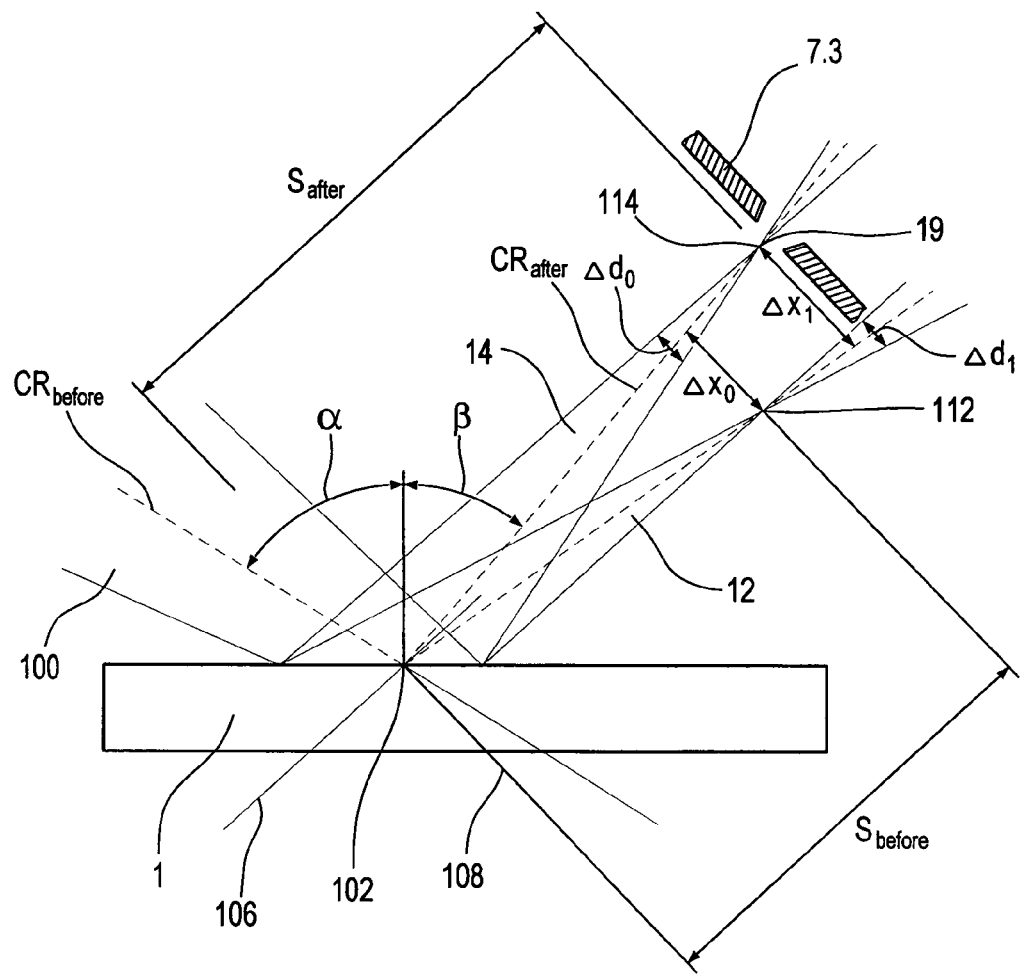
FIG. 2 shows the grating element and the physical diaphragm of an illumination system.

Reference is made to FIG. 2 for the explanation of the following derivation.

In the case shown in FIG. 2, the convergent radiation of a light source (not shown) through grating element 1 is spectrally split and selected at intermediate focus 19 by physical diaphragm 7.3. An NA of 0.12 is achieved at intermediate focus 19. A convergent incident light bundle 100 is shown in FIG. 2. This is diffracted at grating 1. The beam bundle 12 which is diffracted in the $0^{th}$ diffraction order is shown along with the beam bundle 14 which is diffracted in the first diffraction order. The beam bundle diffracted in the $0^{th}$ diffraction order has a focal point 112 and the beam bundle diffracted in the first order has a focal point 114. The image widths $s_{before}$ and $s_{after}$ are defined by the respective focal points 112, 114 and the striking point 102 of the chief ray $CR_{before}$ of the incident beam bundle 100 on grating 1. Here, $s_{before}$ designates the distance of the striking point 102 from the focal point 112 of the beam bundle diffracted in the zeroth diffraction order and $s_{after}$ denotes the distance of striking point 102 from focal point 114 of the beam bundle diffracted in the first order. Angle $\alpha$ designates the angle of incidence of the chief ray $CR_{before}$ of the incident beam bundle with respect to the surface normal line of the carrier surface of grating 1 and $\beta$ denotes the diffraction angle of the chief ray $CR_{after}$ of the beam bundle 14 diffracted in the $1^{st}$ order, relative to the surface normal line of the carrier surface. In addition, the planes 106, 108 are designated, which stand at striking point 102 on grating 1 perpendicular to the chief ray $CR_{before}$ of the striking beam bundle 100 and perpendicular to the chief ray $CR_{after}$ of the beam bundle 14 diffracted in the $1^{st}$ diffraction order.

If one now considers in the convergent beam path of an illumination system a reflection grating, which is placed as shown in FIG. 2 in front of the intermediate focus 19, which coincides in the present example of embodiment with focal point 114 of the beam bundle diffracted in the $1^{st}$ order, then the optical effect of the grating must be observed. This can be derived from the conservation of the phase-space volume or the light value or the Etendue. Since the diffraction angle $\beta$ for orders that are not equal to the zeroth order is not equal to the angle of incidence $\alpha$, the cross section of the beam bundle is modified in planes 106, 108, which stand perpendicular to the chief ray $CR_{before}$ of the incident beam bundle or the chief ray $CR_{after}$ of the diffracted beam pencil. Due to the above-named conservation of balance, the divergence must be changed reciprocally. This means that if a grating is operated in the internal arrangement ($|\alpha|>|\beta|$), then the beam becomes larger by $\cos(\beta)/\cos(\alpha)$ and the divergence becomes smaller by the same factor. By this, the distance up to the focus or focal point is lengthened by the square quadratic factor. This factor is denoted below as the fixed focus constant $c_{ff}$:

$$c_{ff} = \cos(\beta)/\cos(\alpha) \qquad (2)$$

The following results for the bundle cross-section at the grating:

$$d_{after} = d_{before} c_{ff} \qquad (3)$$

or for the numerical aperture NA $$NA_{after} = NA_{before}/c_{ff} \qquad (4)$$

wherein $d_{after}$ denotes the bundle cross-section of the diffracted beam bundle 14 in the plane 108 and $d_{before}$ denotes the bundle cross-section of the incident beam bundle 100 in plane 106, $NA_{after}$ denotes the numerical aperture of the diffracted beam bundle 14 and $NA_{before}$ denotes the numerical aperture of the incident beam bundle.

The following results for the image width s as previously defined, calculated starting at the grating:

$$s_{after} = s_{before} c_{ff}^2 \qquad (5)$$

Care has to be taken that the grating acts only in the meridional or dispersive direction. In order to obtain a stigmatic imaging it is advantageous to introduce an additional optical effect, e.g., in the sagittal direction.

This can be achieved, for example, for the case when an internal diffraction order (k=1, 2, 3) is used, by a convex curvature in the sagittal direction.

For the case when an external diffraction order (k=−1, −2, −3) is used, it is advantageous that the grating is selected as sagittal concave.

Alternatively to a curved grating, the grating line distance may also be varied.

For the case of a sagiftal convex curvature, the radius must be selected such that an image width of $s_{before} c_{ff}^2$ is obtained from the image width $s_{before}$ in the $0^{th}$ order. The sagittal focal distance $f_s$ can be calculated by means of the imaging equation:

$$f_s = s_{before}/(1/c_{ff}^2 - 1) \qquad (6)$$

Finally, the sagittal radius results together with the angle of diffraction:

$$R_s = f_s(\cos\alpha + \cos\beta) \qquad (7)$$

It will be estimated in the following on an example of embodiment how a grating element 1 must be constructed that the following conditions are fulfilled:

- the beam bundles of the $0^{th}$ and $1^{st}$ order or $-1^{st}$ order are separated, i.e., at the focal point of one beam pencil of one diffraction order, there is no overlap of this beam bundle by a beam bundle of another diffraction order;
- the utilization wavelength used must be separate from the unwanted wavelengths;
- the distance to the intermediate focus must be small, so the grating does not become too large;
- the diffraction geometry must be optimized for best diffraction efficiency;
- the astigmatism, which produces a defocusing effect for the internal order and a focusing effect for the external order, should remain small.

In particular, the first condition is decisive for the effectiveness of the grating element. A formula for estimating the separation of the beam pencil of the different diffraction orders from one another can be derived as follows with reference to FIG. 2. The distance $\Delta x_0$ between the chief rays of the beam bundles of different diffraction orders at the focal point of the 0 order from the diffraction angles is:

$$\Delta x_0 = s_{before} \sin(\alpha+\beta) \qquad (8)$$

and the distance $\Delta x_1$ between the chief rays of the beam bundles of different diffraction orders at the focal point of the diffraction order e.g. the $1^{st}$ or $-1^{st}$ diffraction order is:

$$\Delta x_1 = s_{before} c_{ff}^2 \sin(\alpha+\beta) \qquad (9)$$

Since the respective other beam bundle is not focused, which means that it has an extension, it is necessary for estimating whether the beam pencils do not overlap in the focal point, to estimate the extension of the other beam bundle. This can be estimated by the divergence or the numerical aperture. For the extension of the beam bundle of the $0^{th}$ order at the focal point of the diffraction order, the following results:

$$\Delta d_1 = 2\, NA\, c_{ff} |s_{before} c_{ff}^2 - s_{before}| \qquad (10)$$

and for the extension of the beam bundle of the $1^{st}$ order or of the $-1^{st}$ order at the focal point of the $1^{st}$ order or the $-1^{st}$ order:

$$\Delta d_0 = 2\, NA |s_{before} c_{ff}^2 - s_{before}| \qquad (11)$$

The difference between, e.g., $\Delta x_0$ and $\Delta d_0/2$ yields, e.g., the distance of the edge rays of the diffracted beam bundle from the focal point of the beam bundle of the $0^{th}$ order. In order to prevent an overlap of different beam bundles, this distance should correspond to at least half the diameter of the beam bundle in the focal point, which is denoted $\Delta x_f$; a sufficient separation of the beam bundle of the $0^{th}$ diffraction order from the beam bundles of other diffraction orders is then achieved.

The following is thus applied:

$$s_{before} \sin(\alpha+\beta) - NA\, |s_{before} c_{ff}^2 - s_{before}| > \Delta X_f \qquad (12)$$

or $$s_{before} c_{ff}^2 \sin(\alpha+\beta) - NA\, c_{ff} |s_{before} c_{ff}^2 - s_{before}| c_{ff} > \Delta x_f \qquad (13)$$

With the above-given considerations and formulas, the grating element with sagittal convex curvature, which is characterized by a grating efficiency of 56% can be constructed, which is characterized by the values given below in Table 1.

TABLE 1

Characteristic values of a grating element with convex transverse curvature

| | | |
|---|---|---|
| Wavelength | 13.4 | nm |
| Photon energy | 92.5 | eV |
| Number of lines | 1600 | l/mm |
| Diffraction order | 1 | |
| fixed focus constant, $c_{ff}$ | 1.2 | |
| angle of incidence α of the chief ray $CR_{before}$ | 72.360 | degrees |
| Diffraction angle β of the chief ray $CR_{after}$ diffracted in the $1^{st}$ order | −68.676 | degrees |
| Blazed depth | 20.1 | nm |
| Grating-focus distance | 432 | mm |
| Sagittal radius | 654.555 | mm |
| NA (after grating) | 0.12 | |
| Grating length | 237 | mm |
| Material used | Ru | |
| Microroughness | 0.5 | nm (rms) |
| Grating efficiency | 56 | % |

With the grating element 1 according to the embodiment in Table 1 in combination with a diaphragm, wavelengths above approximately 18 nm and below 8 nm can be almost completely filtered out. The heat load on the mirror of a projection system can be clearly reduced in this way.

In order to obtain a grating element 1 with optimal diffraction efficiency, the grating element is preferably configured as a blazed grating.

Figure 3:
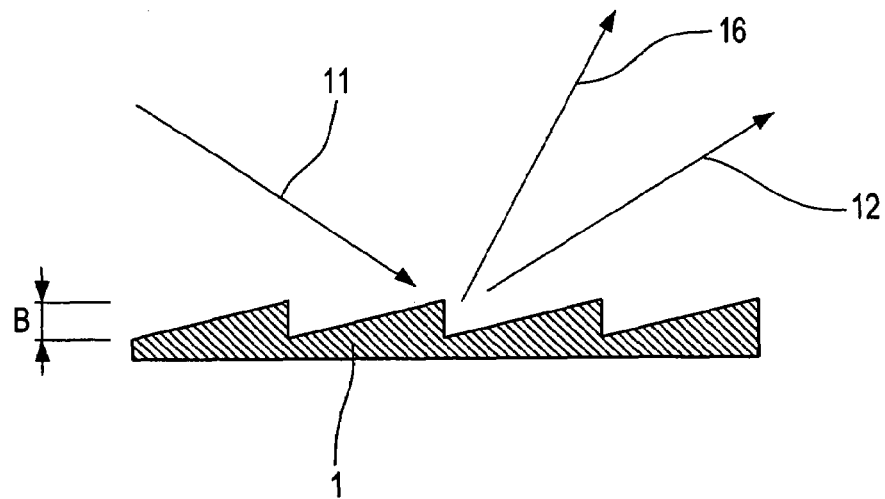
FIG. 3 shows a blazed grating.

A blazed grating with approximately triangular groove profile is shown in FIG. 3. Reference number 11 designates the ray e.g., the chief ray of a beam bundle, striking the grating element 1 designed as a blazed grating; 12 denotes the ray, e.g. the chief ray of a beam bundle, reflected at the grating in the $0^{th}$ order and 16 denotes the ray, e.g., the chief ray of a beam bundle, diffracted in the $-1^{st}$ order. The blazed depth B is a function of angles of incidence and reflection. Thus, it is advantageous if the blazed depth is changed as a function of the position on the grating in order to obtain a maximal diffraction efficiency with a convergent beam pencil.

Figure 4:
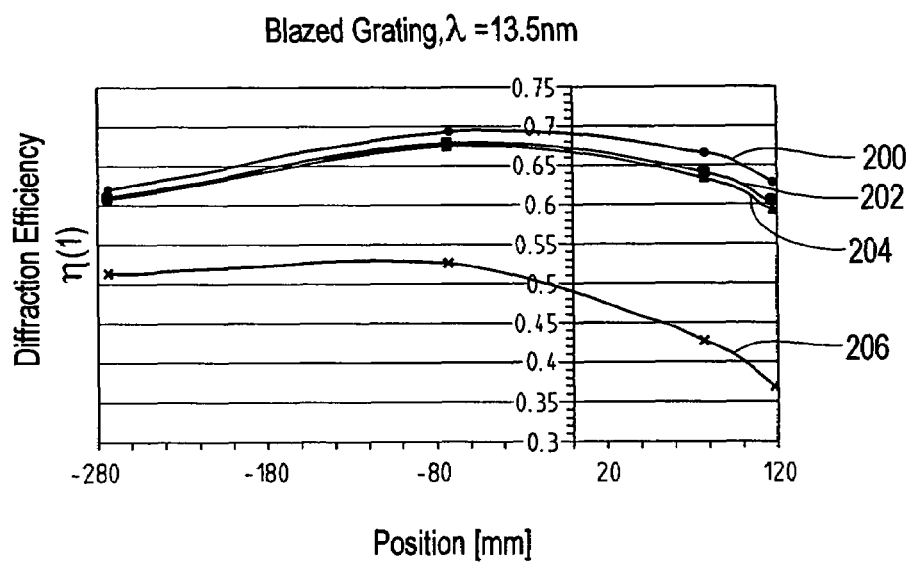
FIG. 4 shows the maximal possible diffraction efficiency for grating elements designed as blazed gratings.

If one uses such a grating element, whose local blazed depth B changes with position on the grating, then a maximal efficiency is obtained according to FIG. 4. As FIG. 4 shows, the diffraction efficiency $\eta(1)$ depends on the material used.

In FIG. 4, reference number 200 denotes the diffraction efficiency $\eta(1)$ for a wavelength of $\lambda=13.5$ nm for ruthenium, reference number 202 for palladium, reference number 204 for rhodium and reference number 206 for gold.

As can be seen from FIG. 4, the greatest efficiency of 0.7 can be achieved with ruthenium. A coating of palladium or rhodium has better long-time properties, but has an efficiency $\eta(1)$ of only 0.67, which is 3% poorer. Gold is usually used for the synchrotron grating, but has a clearly poorer efficiency than the above-named materials at $\lambda=13.5$ nm, as can be seen from curve 206.

Figure 5:
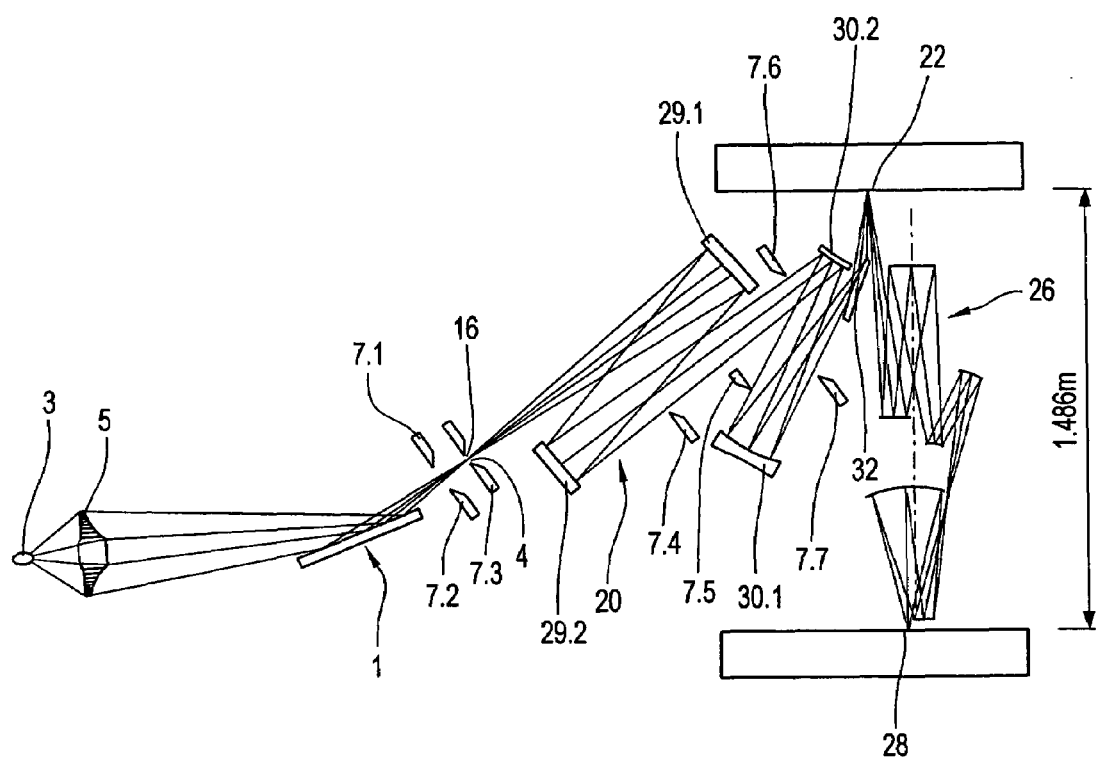
FIG. 5 shows an EUV projection exposure system with an illumination system according to the invention.

An EUV projection exposure system with a grating element 1 according to the invention is shown in FIG. 5. The EUV projection exposure system comprises a light source 3, a collecting optical component, a so-called collector 5, which is formed as a nested collector. Collector 5 images the light source 3 lying in the object plane of the illumination system in a secondary light source 4 in or in the vicinity of a diaphragm plane 7.3.

Light source 3, which can be, for example, a laser plasma source or a plasma discharge source, is arranged in the object plane of the illumination system. The image of the primary light source, which is also designated as the secondary light source, comes to lie in the image plane 7.3 of the illumination system.

Additional diaphragms 7.1, 7.2 are arranged between grating element 1 and the physical diaphragm 7.3 in order to block the light of undesired wavelengths, particularly wavelengths longer than 30 mm. According to the invention, the focus of the $1^{st}$ order comes to lie in the plane of diaphragm 7.3, i.e., light source 3 is imaged nearly stigmatic in the plane of diaphragm 7.3 by the collector and the grating spectral filter in the $1^{st}$ diffraction order. The imaging in all other diffraction orders is not stigmatic.

In addition, the illumination system of the projection system comprises an optical system 20 for forming and illuminating field plane 22 with a ring-shaped field. The optical system comprises two faceted mirrors 29.1, 29.2 as well as two imaging mirrors 30.1, 30.2 and a field-forming grazing-incidence mirror 32 as the mixing unit for homogeneous illumination of the field. Additional diaphragms 7.4, 7.5, 7.6, 7.7 are arranged in optical system 20 for suppressing stray light.

The first faceted mirror 29.1, the so-called field-faceted mirror, produces a plurality of secondary light sources in or in the vicinity of the plane of the second faceted mirror 29.2, the so-called pupil-faceted mirror. The subsequent imaging optics image the pupil-faceted mirror 29.2 in the exit pupil of the illumination system, which comes to lie in the entrance pupil of the projection objective 26. The angle of inclination of the individual facets of the first and second faceted mirrors 29.1, 29.2 are designed in such a way that the images of the individual field facets of the first faceted mirror 29.1 overlap in the field plane 22 of the illumination system and thus an extensively homogenized illumination of a pattern-bearing mask, which comes to lie in the field plane 22, is possible. The segment of the ring field is formed by means of the field-forming grazing-incidence mirror 32 operated under grazing incidence.

A double-faceted illumination system is disclosed, for example, in U.S. Pat. No. 6,198,739, imaging and field-forming components in PCT/EP/00/07258. The disclosure contents of these documents is incorporated to the full extent in the present Application.

The pattern-bearing mask, which is also designated as the reticle, is arranged in field plane 22. The mask is imaged by means of a projection objective 26 in the image plane 28 of field plane 22. The projection objective 26 is a 6-mirror projection objective, such as disclosed, for example, in U.S. application Ser. No. 60/255214, filed on Dec. 13, 2000, in the U.S. Patent Office for the Applicant or DE-A-10037870, the disclosure content of which is fully incorporated into the present application. The object to be exposed, for example, a wafer, is arranged in image plane 28.

The replica technique is considered, for example, as a possible manufacturing method for a grating element according to the invention.

Figure 6:
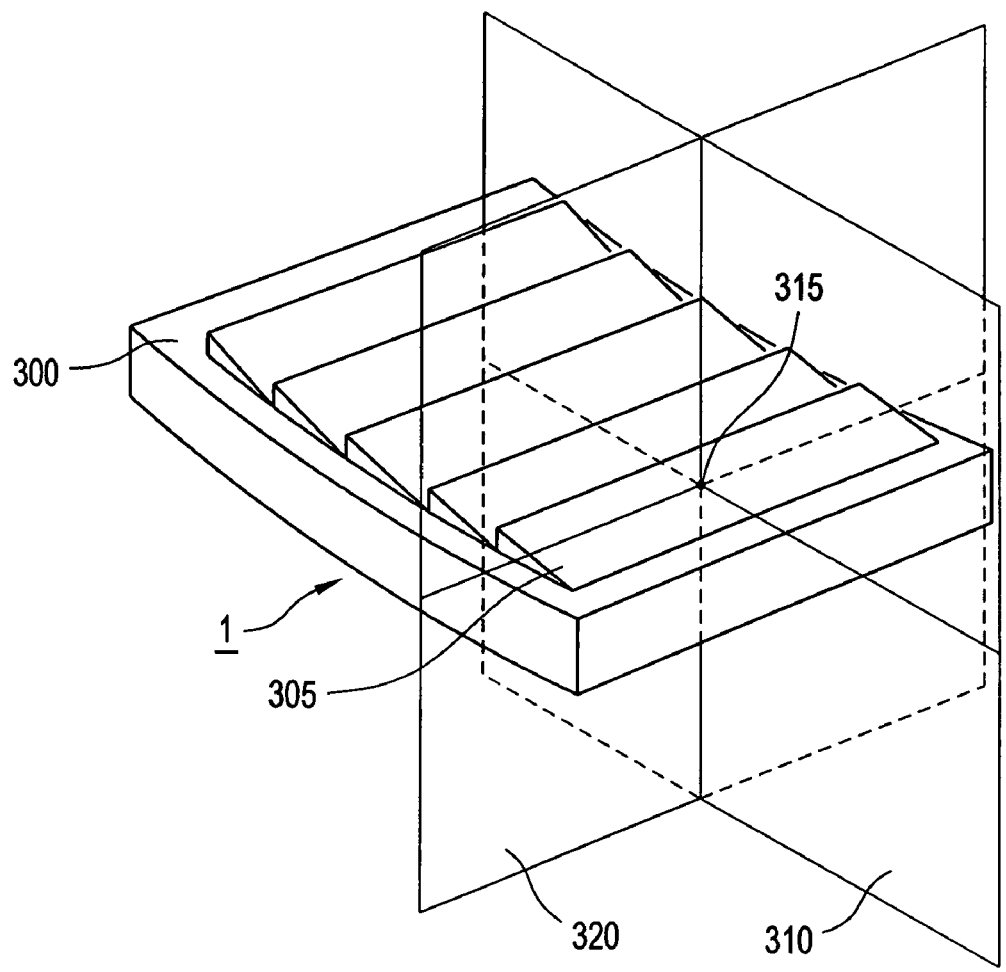
FIG. 6 is an illustration of a grating for employment in an illumination system.

FIG. 6 is an illustration of a grating 1 for employment in an illumination system. Grating 1 includes a carrier surface 300 and a plurality of grating lines, one of which is identified with reference number 305 in FIG. 6. Each of the grating lines has a center, one of which is represented with reference numeral 315. A meridional plane 310 is defined as being perpendicular to grating line 305. A sagittal plane 320 is defined as being perpendicular to carrier surface 300, parallel to grating line 305 and including center 315.

Figure 7A:
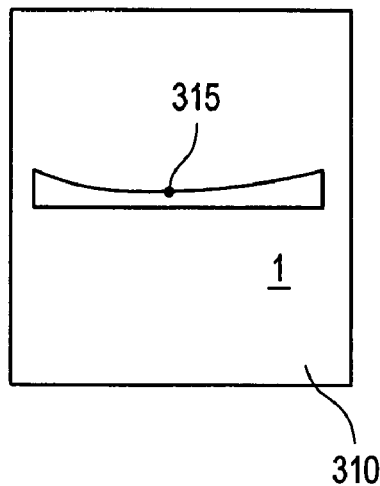
FIGS. 7a and 7b show a sectional view of the grating of FIG. 6 at a meridonal plane.
Figure 7B:
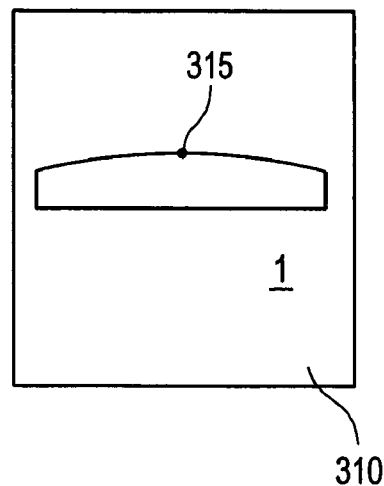

FIGS. 7a and 7b show a sectional view of grating 1 at meridonal plane 310. Carrier surface 300 is curved, either concave or convex, in meridonal plane 310.

Figure 7C:
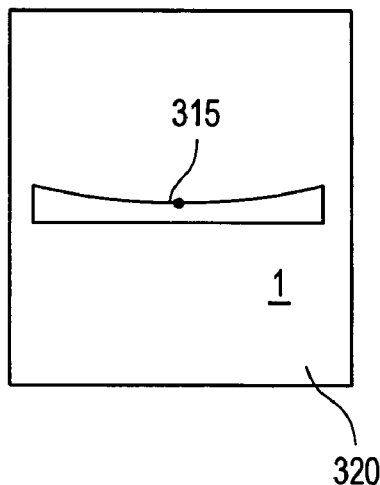
FIGS. 7c and 7d show a sectional view of the grating of FIG. 6 at a sagittal plane.
Figure 7D:
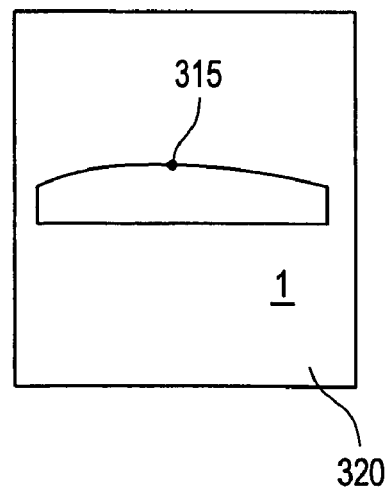

FIGS. 7c and 7d show a sectional view of grating 1 at sagittal plane 320. Grating element 1 is curved, either convex or concave, in sagittal plane 320.

Figure 8:
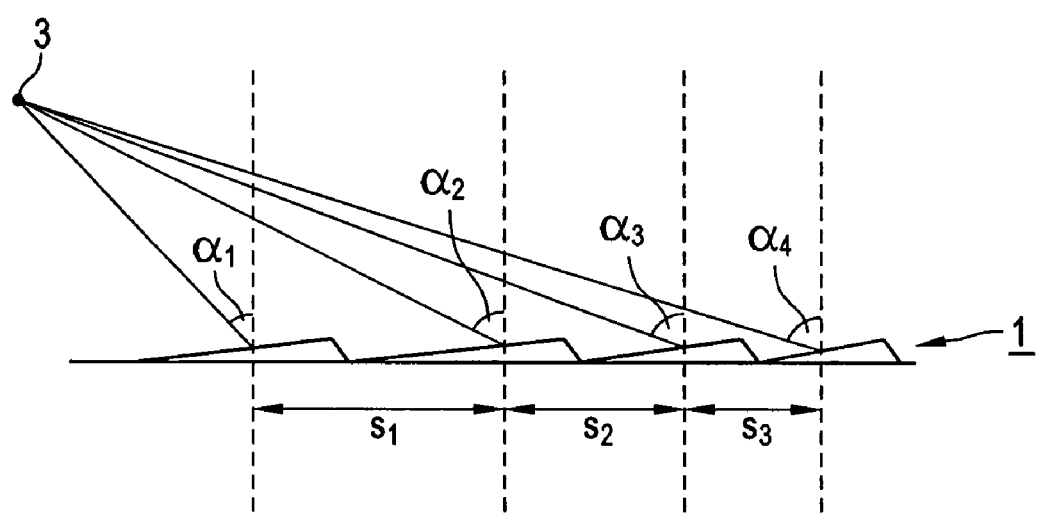
FIG. 8 is a side view of the grating of FIG. 6.

FIG. 8 is a side view of grating 1. There is a distance $s_1$ from a center of a first grating line 305 to a center of a second grating line 305, a distance $s_2$ from a center of the second grating line 305 to a center of a third grating line 305, and a distance $s_3$ from a center of the third grating line 305 to a center of a fourth grating line 305. Preferably the distances $s_1$, $s_2$ and $s_3$ decrease as angles of incidence $\alpha_1$, $\alpha_2$, $\alpha_3$, $\alpha_4$ of rays of an incident light bundle become larger. Thus, as shown in FIG. 8, whereas $\alpha_1 < \alpha_2 < \alpha_3 < \alpha_4$, $s_1 > s_2 > s_3$.

The invention gives for the first time an illumination system, with which undesired wavelengths can be selected directly after the light-source unit and which represents an alternative to filter foils, which are problematic, particularly with respect to the heat load.

REFERENCE LIST 1 grating element
3 light source
5 collector
7.1, 7.2, 7.3
7.4, 7.5, 7.6
7.7 diaphragms
8 cooling device
10.1, 10.2 inlet and outlet of the cooling device
11 incident radiation
12 $0^{th}$ order of the wavelength used
14 $1^{st}$ order of the wavelength used
16 $-1^{st}$ order of the wavelength used
20 optical system
22 field plane
26 projection objective
28 image plane of the field plane
29.1, 29.2 faceted mirrors
30.1, 30.2 imaging mirrors
32 field-forming mirror
34 exit pupil of the illumination system
100 convergent incident beam bundle
102 striking point of the chief ray $CR_{before}$ on grating 1
106 plane, which is perpendicular to the chief ray $CR_{before}$
106 plane, which is perpendicular to the chief ray $CR_{after}$
112 focal point of the beam pencil diffracted in the $0^{th}$ order
114 focal point of the beam pencil diffracted in the $1^{st}$ order
200, 202
204, 206 diffraction efficiency $\eta(1)$ for different materials

The invention claimed is:

1. An illumination system, comprising:
    a light source for providing light having a wavelength $\leq 100$ nm;
    a collector unit for receiving said light and producing a convergent light bundle;
    a field plane;
    a grating element situated in a beam path from said light source to said field plane,
        wherein said grating element diffracts said convergent light bundle and produces a diffracted light bundle;
    a physical diaphragm in a diaphragm plane, situated in said beam path downstream of said grating element, wherein said illumination system forms an intermediate image of said light source that is substantially located in said diaphragm plane; and
    a mirror having a plurality of facets situated in said beam path downstream of said physical diaphragm, for illuminating a field in said field plane with images of said plurality of facets that overlap one another.

2. Illumination system according to claim 1,
    wherein said grating element produces a light bundle of a $k^{th}$ diffraction order with a focal point at said physical diaphragm, and
    wherein |k| is $\geq 1$.

3. Illumination system according to claim 2,
    wherein said physical diaphragm passes a ray of said $k^{th}$ diffraction order of said grating element and blocks all rays of an $m^{th}$ diffraction order to more than 90%, and wherein $m \neq k$.

4. Illumination system according to claim 1, wherein said wavelength is in a range of about 7–26 nm.

5. Illumination system according to claim 1,
    wherein said grating element comprises a carrier surface and a grating line, and a meridional plane is defined as being perpendicular to said carrier surface and perpendicular to said grating line, and
    wherein said carrier surface is curved concave or convex in the meridional plane.

6. Illumination system according to claim 1,
    wherein said grating element has a center and comprises a carrier surface and a grating line, and a sagittal plane is defined as being perpendicular to said carrier surface, parallel to said grating line, and including said center of said grating element, and
    wherein said grating element is curved convex or concave in said sagittal plane.

7. Illumination system according to claim 1, wherein said grating element comprises a plurality of grating lines having varying distances therebetween.

8. Illumination system according to claim 7, wherein said varying distances decrease as angles of incidence of rays of an incident light bundle become larger.

9. Illumination system according to claim 1, wherein said grating element is a blazed grating.

10. Illumination system according to claim 1,
    wherein said light source is a primary light source, and
    wherein said primary light source is imaged into a secondary light source at said physical diaphragm.

11. Illumination system according to claim 1,
    wherein said field in said field plane is a segment of a ring field, and
    wherein said illumination system further comprises field-forming components.

12. Illumination system according to claim 1, further comprising another physical diaphragm in said beam path upstream of said diaphragm plane.

13. Projection exposure system for the production of microelectronic components comprising:
    the illumination system according to claim 1;
    a projection objective; and
    an image plane,
    wherein said illumination system illuminates a pattern-bearing mask in said field plane, and said projection objective images said pattern-bearing mask on a light-sensitive object in said image plane.

14. Method for the production of microelectronic components, comprising employing the projection exposure system according to claim 13.

15. Illumination system comprising:
    a diffraction grating element; and
    a first physical diaphragm in a diaphragm plane after said diffraction grating element, in a beam path from a light source, of light having a wavelength $\leq 100$ nm, to a field plane;
    an optical system, located between said diaphragm plane and said field plane, for forming and illuminating a field in said field plane, wherein said optical system includes a facetted mirror for homogeneously illuminating said field in said field plane; and
    a second physical diaphragm in said beam path, after said first physical diaphragm, for suppressing stray light.

16. Illumination system according to claim 15, further comprising a collector unit for producing a convergent light bundle, wherein said convergent light bundle is incident on said diffraction grating element.

17. Illumination system according to claim 15,
    wherein said diffraction grating element produces a light bundle of a $k^t$ diffraction order with a focal point at said first physical diaphragm, and
    wherein $|k| \geq 1$.

18. Illumination system according to claim 17,
wherein a ray of said diffraction grating element passes said first physical diaphragm and said first physical diaphragm blocks all rays of an $m^{th}$ diffraction order to more than 90%, and
wherein $m \neq k$.

19. Illumination system according to claim 15, wherein said wavelength is in a range of about 7–26 nm.

20. Illumination system according to claim 15,
wherein said diffraction grating element comprises a carrier surface and a grating line, and a meridional plane is defined as being perpendicular to said carrier surface and perpendicular to said grating line, and
wherein said carrier surface is curved concave or convex in the meridional plane.

21. Illumination system according to claim 15,
wherein said diffraction grating element has a center and comprises a carrier surface and a grating line, and a sagittal plane is defined as being perpendicular to said carrier surface, parallel to said grating line, and including said center of said diffraction grating element, and
wherein said diffraction grating element is curved convex or concave in said sagittal plane.

22. Illumination system according to claim 15, wherein said diffraction grating element comprises a plurality of grating lines having varying distances therebetween.

23. Illumination system according to claim 22, wherein said varying distances decrease as angles of incidence rays of an incident light bundle become larger.

24. Illumination system according to claim 15, wherein said diffraction grating element is a blazed diffraction grating.

25. Illumination system according to claim 15,
wherein said light source is a primary light source, and
wherein said primary light source is imaged into a secondary light source at said first physical diaphragm.

26. Illumination system according to claim 15,
wherein said field in said field plane is a segment of a ring field, and
wherein said optical system comprises field-forming components.

27. Projection exposure system for the production of microelectronic components comprising:
the illumination system of claim 15;
a pattern bearing mask;
a projection objective; and
a light sensitive object,
wherein said pattern-bearing mask is imaged onto said light sensitive object.

28. Method for the production of microelectronic components, comprising employing the projection exposure system according to claim 27.

29. Illumination system comprising:
a diffraction grating element;
a first physical diaphragm in a beam path between said diffraction grating element and a diaphragm plane; and
a second physical diaphragm in said diaphragm plane; and
an optical system for forming and illuminating a field in a field plane, wherein said optical system is located between said diaphragm plane and said field plane, and includes a facetted mirror for homogeneously illuminating said field in said field plane,
wherein said diffraction grating element receives light having a wavelength $\leq 100$ nm and produces a light bundle of a $k^{th}$ diffraction order with a focal point at said second physical diaphragm,
wherein $|k| \geq 1$.

30. Illumination system according to claim 29,
wherein a ray of said diffraction grating element passes said second physical diaphragm and said second physical diaphragm blocks all rays of an $m^{th}$ diffraction order to more than 90%, and
wherein $m \neq k$.

31. Illumination system according to claim 29, wherein said wavelength is in a range of about 7–26 nm.

32. Illumination system according to claim 29,
wherein said diffraction grating element comprises a carrier surface and a grating line, and a meridional plane is defined as being perpendicular to said carrier surface and perpendicular to said grating line, and
wherein said carrier surface is curved concave or convex in the meridional plane.

33. Illumination system according to claim 29,
wherein said diffraction grating element has a center and comprises a carrier surface and a grating line, and a sagittal plane is defined as being perpendicular to said carrier surface, parallel to said grating line, and including said center of said diffraction grating element, and
wherein said diffraction grating element is curved convex or concave in said sagittal plane.

34. Illumination system according to claim 29, wherein said diffraction grating element comprises a plurality of grating lines having varying distances therebetween.

35. Illumination system according to claim 34, wherein said varying distances decrease as angles of incidence rays of an incident light bundle become larger.

36. Illumination system according to claim 29, wherein said diffraction grating element is a blazed diffraction grating.

37. Illumination system according to claim 29, further comprising a primary light source, for providing said light, situated in said object plane, wherein said primary light source is imaged into a secondary light source at said second physical diaphragm.

38. Illumination system according to claim 29,
wherein said field in said field plane is a segment of a ring field, and
wherein said optical system comprises field-forming components.

39. Projection exposure system for the production of microelectronic components comprising:
the illumination system of claim 29, for illuminating a pattern-bearing mask; and
a projection objective for imaging said pattern-bearing mask onto a light-sensitive object.

40. Method for the production of microelectronic components, comprising employing the projection exposure system according to claim 39.

* * * * *